United States Patent
Yilmaz

(10) Patent No.: US 11,581,432 B2
(45) Date of Patent: Feb. 14, 2023

(54) SMALL PITCH SUPER JUNCTION MOSFET STRUCTURE AND METHOD

(71) Applicant: IPOWER SEMICONDUCTOR, Gilroy, CA (US)

(72) Inventor: Hamza Yilmaz, Gilroy, CA (US)

(73) Assignee: IPOWER SEMICONDUCTOR, Gilroy, CA (US)

( * ) Notice: Subject to any disclaimer, the term of this patent is extended or adjusted under 35 U.S.C. 154(b) by 37 days.

(21) Appl. No.: 17/367,584

(22) Filed: Jul. 5, 2021

(65) Prior Publication Data

US 2021/0336051 A1 Oct. 28, 2021

Related U.S. Application Data

(63) Continuation of application No. 16/391,197, filed on Apr. 22, 2019, now Pat. No. 11,056,585.

(60) Provisional application No. 62/660,904, filed on Apr. 20, 2018.

(51) Int. Cl.
| | |
|---|---|
| H01L 29/78 | (2006.01) |
| H01L 29/10 | (2006.01) |
| H01L 29/06 | (2006.01) |
| H01L 29/423 | (2006.01) |
| H01L 29/40 | (2006.01) |
| H01L 21/265 | (2006.01) |
| H01L 21/02 | (2006.01) |
| H01L 29/66 | (2006.01) |
| H01L 29/739 | (2006.01) |

(52) U.S. Cl.
CPC .... *H01L 29/7811* (2013.01); *H01L 21/02381* (2013.01); *H01L 21/02532* (2013.01); *H01L 21/02634* (2013.01); *H01L 21/26513* (2013.01); *H01L 29/0634* (2013.01); *H01L 29/0657* (2013.01); *H01L 29/1095* (2013.01); *H01L 29/404* (2013.01); *H01L 29/4236* (2013.01); *H01L 29/66712* (2013.01); *H01L 29/7813* (2013.01); *H01L 29/66348* (2013.01); *H01L 29/7397* (2013.01)

(58) Field of Classification Search
CPC ............. H01L 29/0657; H01L 29/4236; H01L 21/26513; H01L 21/02381; H01L 21/02532; H01L 21/02634; H01L 29/66712; H01L 29/41766; H01L 29/66734; H01L 29/0688; H01L 29/0696
See application file for complete search history.

(56) References Cited

U.S. PATENT DOCUMENTS

| | | | |
|---|---|---|---|
| 8,524,552 B2 * | 9/2013 | Arai | H01L 29/045 257/E21.313 |
| 9,190,469 B2 * | 11/2015 | Jun | H01L 29/66712 |
| 9,755,058 B2 * | 9/2017 | Harrington, III | H01L 29/0619 |
| 2017/0054009 A1 * | 2/2017 | Lee | H01L 29/66333 |

* cited by examiner

*Primary Examiner* — Karen Kusumakar
*Assistant Examiner* — Adam S Bowen
(74) *Attorney, Agent, or Firm* — Halit N. Yakupoglu

(57) ABSTRACT

The present invention provides semiconductor devices with super junction drift regions that are capable of blocking voltage. A super junction drift region is an epitaxial semiconductor layer located between a top electrode and a bottom electrode of the semiconductor device. The super junction drift region includes a plurality of pillars having P type conductivity, formed in the super junction drift region, which are surrounded by an N type material of the super junction drift region.

15 Claims, 20 Drawing Sheets

SMALL PITCH SUPER JUNCTION MOSFET STRUCTURE AND METHOD

CROSS REFERENCE TO RELATED APPLICATIONS

This application is a continuation of U.S. patent application Ser. No. 16/391,197 filed on Apr. 22, 2019, which relates to and claims priority from U.S. provisional patent application Ser. No. 62/660,904 filed on Apr. 20, 2018, which are expressly incorporated by reference herein in their entirety.

BACKGROUND

Field of the Invention

The present invention relates to semiconductor devices, more particularly, to device structures and methods of forming trench metal oxide semiconductor field effect transistor (MOSFET) devices.

Description of the Related Art

Super junction (SJ) concept or charge balanced (CB) concept is based on a semiconductor structure made of laterally depleted p and n type semiconductor regions. Such semiconductor structures can have significantly low voltage drop when they are turned on as a switch.

In particular, when vertically applied, reversed bias voltages can enable such structures to achieve much higher breakdown capabilities than one sided PN junction structures with the same doping concentration. As illustrated in FIG. 1, total net charge laterally within the P and N regions, or as often called CB regions, is equal due to the charge balance. After complete lateral depletion of the CB region when PN junction is vertically reverse biased, laterally depleted CB region can act like an insulator in vertical direction, therefore electric field due to vertically applied reverse bias voltage, can be significantly lower compare to a PN junction which is not laterally depleted.

In the prior art CB principle has been applied to various devices. In particular, U.S. Pat. No. 4,754,310 disclosed a CB application in lateral high voltage MOSFET devices, and U.S. Pat. No. 5,216,275 disclosed another CB application in vertical high voltage power devices including power MOSFETs. Also, U.S. Pat. No. 6,630,698 disclosed a CB application in enhancements on avalanche ruggedness and multilayer epitaxial implementation for the vertical super junction (SJ) power MOSFET devices with suggestion for high voltage termination regions.

Basic one dimensional (1D) charge balance of P and N pair (region) shown in FIG. 1 can be given as total ionized donors ($N_d$) in the N region and total acceptors ($N_a$) in the P region in Equation 1 can be given as follows:

$$N_d \cdot W_n = N_a \cdot W_p \quad \text{[Equation 1]}$$

Where, $N_d$ is donor concentration per unit volume ($cm^{-3}$), $N_a$ is acceptor concentration per unit volume ($cm^{-3}$), $W_n$ is width of N type region of the super junction, and $W_p$ is width of P type region of the super junction. This is a good approximation for a strip cell type super junction structure 10 as shown in FIG. 1 which illustrated an exemplary device structure with fully depleted P and N regions as well as a charge balanced PN junction.

Using the CB concept, in one example, a 600V SJ MOSFET can yield 10 times lower specific on resistance (Area·On-Resistance) than a conventional epi (concentration and thickness) based 600V MOSFET. Here, the term 'specific on resistance' defines a resistance of the power MOSFET per unit area when it is turned on.

On resistance of the high voltage (HV) SJ power MOSFETs can be improved by the reduction of the widths of P and N regions (small cell pitch approach) by employing P and N pillar structures. Because the small and large pitch pair of P and N pillars will have the same charge (about q 1E12 $cm^{-2}$, where q is the electron charge), the on resistance of narrow and wider pair of P and N pillars will be about the same, if the concentration dependence of the electron mobility is ignored. There can be proportionally more small pitch pair of P and N pillars in per unit area, which explains why small pitch SJ power MOSFET devices can have lower resistance. However, in addition to the benefit of reduced on resistance, small pitch SJ MOSFET devices have the following challenges.

In years, the specific on resistance value (Rds·A), which is resistance times the active device area, of the SJ Power MOSFET devices has been reduced below 10 milliohms square centimeter by using small pitch, however the small pitch SJ power MOSFET device structures face the following concerns: (1) undesired reduced breakdown tolerance to charge imbalance of P and N pillars, as a result, there can be a smaller manufacturing window for small pitch SJ MOSFETs; (2) small pitch SJ power MOSFET devices are more fragile than larger pitch SJ MOSFET devices, and the robustness needs to be enhanced since lowered specific on resistance can increase the operating current density; and, (3) resulting unwanted lower MOSFET saturation current due to depletion of the narrow N and P pillars.

SUMMARY

An aspect of the present invention includes a semiconductor device including a drift region that is capable of blocking voltage, the semiconductor device including: a bottom surface and a top surface of the drift region, the bottom surface and the top surface being in electrical connection with a bottom electrode and a top electrode of the semiconductor device, respectively; at least one first conductivity type region of the drift region, the first conductivity type region extending between the top surface and the bottom surface of the drift region, wherein a top portion of the first conductivity type region, which is adjacent the top surface, is larger than a bottom portion of the first conductivity type region, which is adjacent the bottom surface; and a second conductivity type region of the drift region surrounding at least one first conductivity type region, the second conductivity type region extending between the top surface and the bottom surface of the drift region, wherein a top portion of the second conductivity type region, which is adjacent the top surface is smaller than a bottom portion of the second conductivity type region, which is adjacent the bottom surface, wherein the at least one first conductivity type region and the second conductivity type region are repeated having opposite charge in equal magnitudes.

Another aspect of the present invention includes a method of manufacturing a charge balanced semiconductor device, the method including: forming a first layer of a second conductivity type semiconductor over a substrate heavily doped with the second type conductivity dopants; selectively implanting a first conductivity type dopants into the first layer to form at least one bottom zone of at least one pillar; annealing the first layer; forming a second layer of the second conductivity type semiconductor on the first layer;

selectively implanting the first conductivity type dopants into the second layer to form at least on second zone of the at least one pillar; annealing the second layer; and repeating steps of forming, selectively implanting, and annealing until at least one top zone, of the at least one pillar, in a top layer of the second conductivity type semiconductor is formed, wherein each zone of the at least one pillar has rectangular prism shape, and wherein multiple layers of the second conductivity type semiconductor form a second conductivity type semiconductor region surrounding the at least one pillar.

Another aspect of the present invention includes a method of manufacturing a charge balanced semiconductor device, the method including: forming an intrinsic epitaxial layer on top of heavily doped substrate; ion implanting N type dopants without mask and implanting P type dopants via mask to form a first charge balanced layer having a first P type zone and a first N type zone; annealing out the implantation defects at a predetermined temperature range; forming another intrinsic epitaxial layer on the first charge balanced layer; ion implanting N type dopants without mask and implanting P type dopants via mask to form a second charge balanced layer having a second P type zone and a second N type zone, annealing out the implantation defects at the predetermined temperature range; repeating the steps of forming intrinsic epitaxial layer, ion implanting and annealing until a top charge balanced layer having a top P type zone and a top N type zone is formed; and forming within the top charge balanced layer: a transistor body with P type dopant implantation, regions which are orthogonal to the top P type zone, a framing layer via mask by ion implantation of a P type dopant connecting the P type top zones at edge termination regions of the semiconductor device and the N type top zones are compensated by implanting P type dopants to form a subsurface lighter doped N type layer to spread potential laterally further out in the edge termination to achieve high breakdown voltage.

DETAILED DESCRIPTION OF THE EMBODIMENTS

One of the prior art's challenges of each SJ power MOSFET device with different die size requiring its own special epitaxial wafer which integrates super junction (SJ) wafer preparation and SJ power MOSFET fabrication processes. This integration of SJ epitaxial wafer preparation and the SJ MOSFET fabrication causes long cycle times. The present invention may resolve this issue by separating SJ epitaxial wafer preparation from the SJ MOSFET fabrication process.

Preparing SJ wafers and using the same wafers for different size power MOSFET products with the same breakdown voltage may provide the following benefits: minimizing SJ power MOSFET cycle time; reducing the risk of building too much inventory of certain products, by preparing common SJ wafers; and, reducing the manufacturing cost by optimizing SJ wafer preparation and SJ power MOSFET fabrication processes. In this application P type conductivity will be referred to as the first type of conductivity, or the first conductivity, and the N type of conductivity will be referred to as the second type of conductivity, or the second conductivity.

Figure 2A:
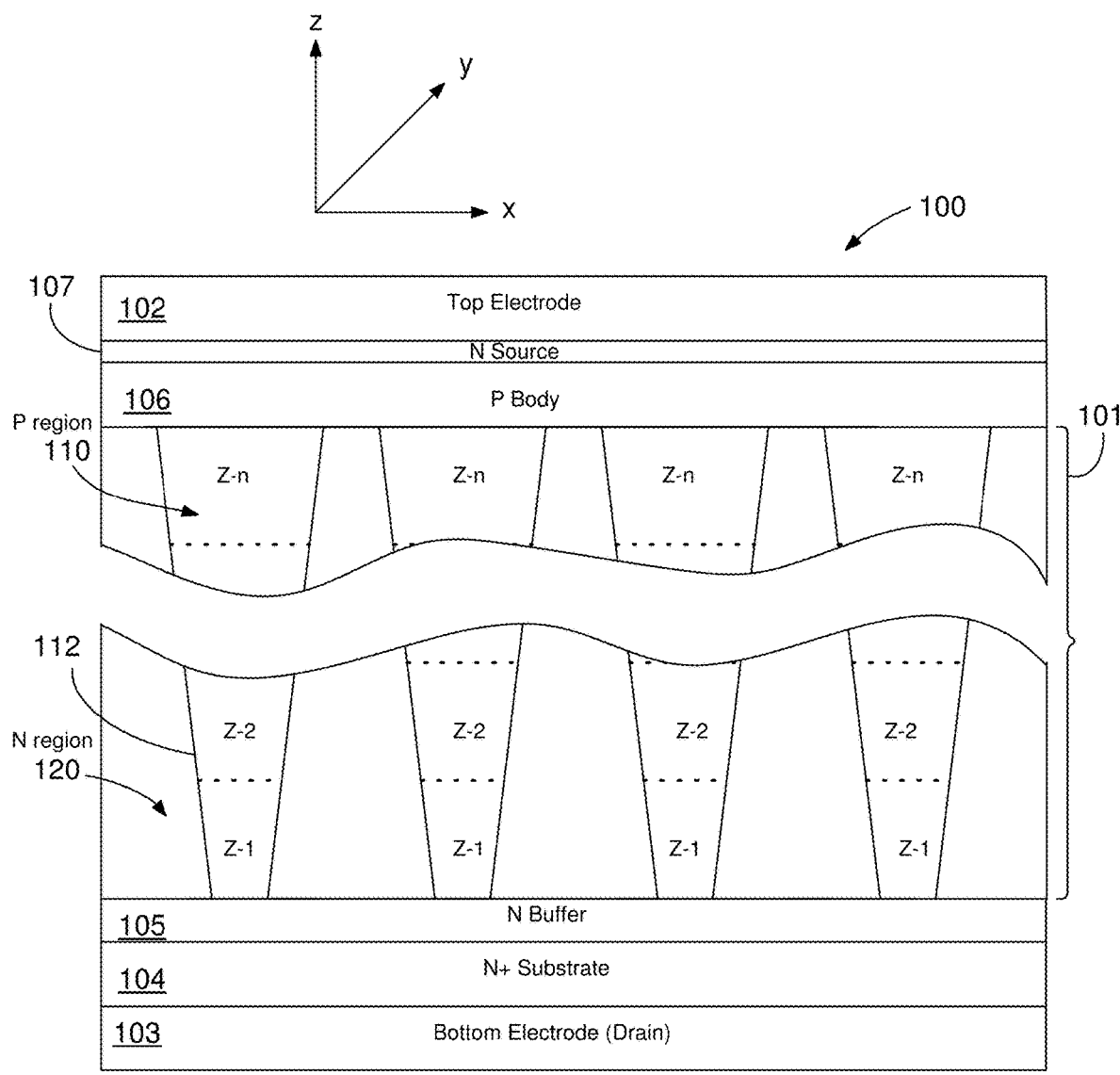
FIGS. 2A-2B are schematic illustrations of embodiments of exemplary charge balanced super junction devices of the present invention.

Embodiments of the present invention may provide semiconductor devices with super junction structures including drift regions that may be capable of blocking voltage. FIG. 2A illustrates a semiconductor device 100 including a super junction drift region 101 located between a top electrode 102, or a first electrode, and a bottom electrode 103, or a second electrode, of the semiconductor device 100. The super junction drift region 101 will be referred to as the drift region 101 hereinafter.

In one embodiment, the drift region 101 may be an epitaxial (epi) single crystal silicon layer grown over the semiconductor substrate 104. The drift region 101 may include more than one epitaxial layers. The drift region 101 may have N type of conductivity, or second type of conductivity, i.e., doped with n type of dopants, such as arsenic (As) or phosphor (P).

The semiconductor substrate may be a silicon substrate having N type of conductivity; however, it is doped with an N type dopant concentration higher than the N type dopant concentration of the semiconductor layer 101, which is denoted with N+. A buffer region 105, having n type of conductivity, may be formed between the drift region 101 and the semiconductor substrate 104. The bottom electrode 103 may be formed on the back surface of the substrate 104. Upper part of the drift region 101 may include a P body region 106 and an N source region 107.

A top surface 101A and a bottom surface 101B of the drift region 101 may be in electrical connection with the top electrode 104 and the bottom electrode 106 of the semiconductor device 100 respectively. A first region 110 of the drift region 101 may extend between the top surface 101A and the bottom surface 101B of the drift region 101. The first region 110 may have a first type conductivity, or P type conductivity, and may include a plurality of pillars 112 having P type conductivity. The first region 110 will be referred to as P region 110 and the pillars 112 will be referred to as P pillars 112 hereinafter. Upper portion of each P pillar 112, which is adjacent the top surface 101A, is substantially larger than the bottom portion, which is adjacent the bottom surface 101B. A second region 120 of the drift region 101, which may surround each P pillar 112 of the first region 110, may also extend between the top surface 101A and the bottom surface 101B of the drift region 101. In this configuration, all the P pillars 112 are called floating, meaning they are not individual pillars and not connected to one another. The second region 120 may have N type conductivity and will be referred to as N region 120 hereinafter. Contrary to the P region 110, an upper portion of the N region 120, which is adjacent the top surface 101A is smaller than the bottom portion of the N region 120, which is adjacent the bottom surface 101B. In this respect, P region 110 may gradually expand in the direction of the top surface 101A while the N region may gradually expand in the direction of the bottom surface 101B. P regions 110 and N regions 120 are alternately configured regions which are configured to have opposite charges in equal magnitudes, i.e., positive charges (holes) in the P region 110 and negative charges (electrons) in the N region 120. P pillars 212 of the P regions 110 and the surrounding N regions 120 form a PN super junction. The PN super junction establishes a super junction cell with the charges in the P region 110 and the N region 120.

In accordance with the present invention, there may be a plurality of zones Z within the drift region 101. In one embodiment, the P pillars 112 may have multiple zones, e.g., Z-1, Z-2, . . . Z-n. Each P region 110 of the drift region 101 may be formed by stacking the zones Z on top of one another to form the P pillars 112 or columns of the P regions 110. The P pillars 112, shaped by the stacked zones, may extend between the top surface 101A and the bottom surface 101B of the drift region 101 and within the matrix of the N region 120. Height of each zone Z along the z-axis may be the same, however the width of each zone may increase along at least one of x and y axis toward the top surface 101A. In other words, a planar area $A_P$ of each P pillar 112, which is defined in the x-y pane, and orthogonal to the vertical axis (z axis) of the pillar may get larger, or expand, along the length of the pillar in the direction toward the top surface 101A. As a result, a selected planar area $A_P$ adjacent the top surface 101A may be larger than a selected planar area $A_P$ adjacent the bottom surface 101B. In one embodiment, this may be achieved by varying the width of the zones Z forming the P pillars 112.

Figure 2B:
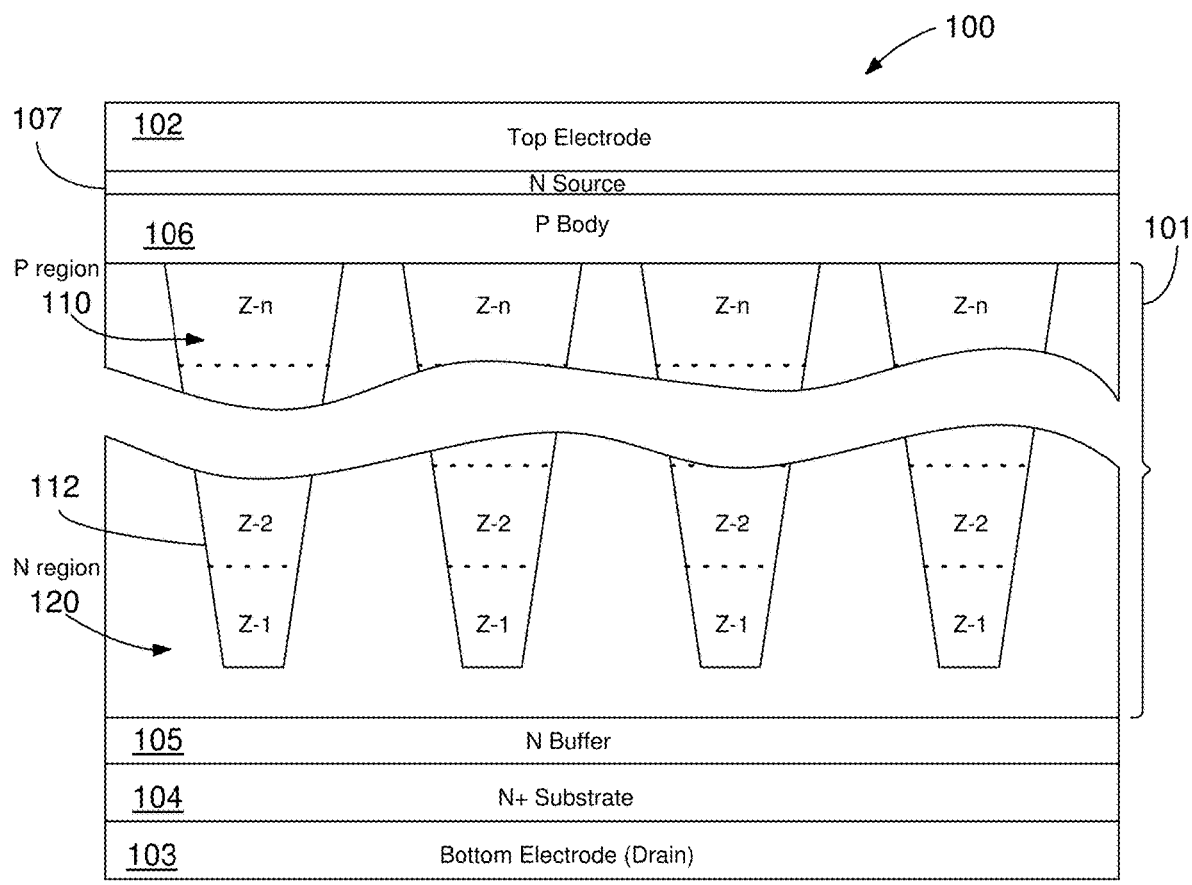

As shown in FIG. 2B, in another embodiment, the first zone Z-1 of the P pillars of the P region may not contact the bottom surface 101B of the drift region 101. In this embodiment, first zone Z-1 of the P pillars may be formed above the bottom surface 101B and within the N region 120 of the drift region 101; therefore they are not in direct contact with the N+ substrate. Each P region 112 may also have varying or different doping levels to obtain a charge balance or a predetermined charge imbalance in each zone.

Figure 3A:
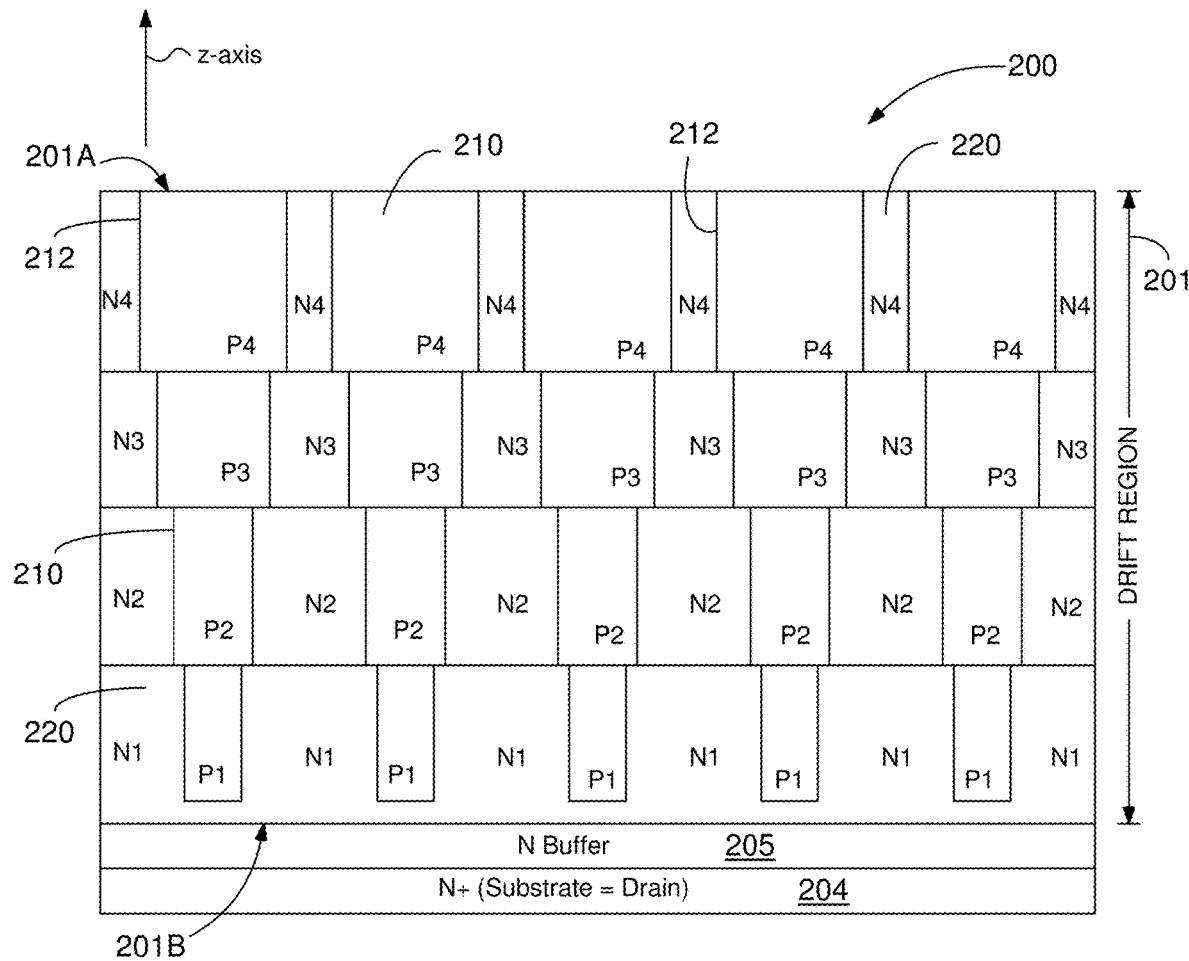
FIG. 3A is a schematic side cross-sectional illustration of a super junction with a plurality of staircase pillar structures.
Figure 3B:
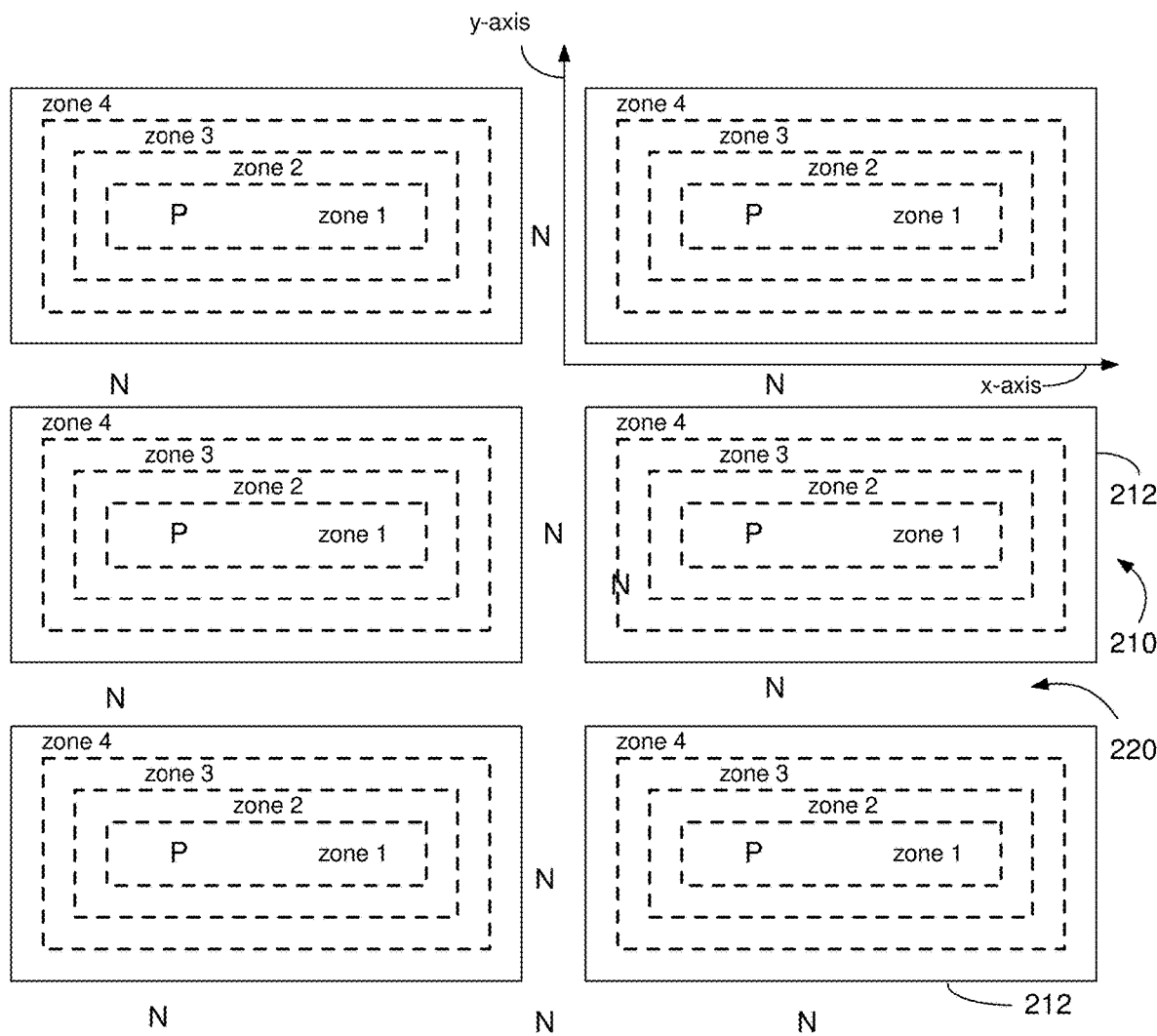
FIG. 3B is a schematic top view illustration of staircase pillars having first zone through fourth zone.

FIGS. 3A-3B show a SJ structure with multi zone staircase P pillars. The SJ structure of this embodiment has floating P pillars. As shown in FIGS. 3A and 3B in side cross sectional and in top views, respectively, in an embodiment, a semiconductor device 200 may include a drift region 201 having n type conductivity formed over a substrate 204 having N+ type conductivity and a buffer region 205 having N type conductivity. In this embodiment, the drift region 201 may include a P region 210 including P pillars 212 having a staircase structure including a stack of multiple rectangular zones Z shaped as rectangular prisms or cuboids in 3 dimension. In FIG. 3A each exemplary P pillar 212 may be made of four zones (Z-1, Z-2, Z-3 and Z-4). However, each zone Z of the P pillars 212 may also be divided into multiple zones. Further more, the zones Z may also have other geometrical 3 dimensional shapes, such as cylindrical, octagonal and the like. The P pillars 212 of the P region 210 may be surrounded by an N region 220, thereby forming a PN super junction.

FIG. 3B shows a top view of projection of zone 1 (bottom zone), zone 2, zone 3 and zone 4 (top zone) of the P pillars 212 stacked on top of the other along the z axis of the device 200 which is orthogonal to the top surface 201A and the bottom surface 201B of the drift region 201.

Each zone of the pillar, e.g., zone 1, zone 2, zone 3 and zone 4 may have, for example, a thickness or height of about 10 microns for a 600V MOSFET device. In one embodiment zone 1 of the P pillar may be formed on top of an N buffer region grown on an N+ substrate. Zone 1 may have the smallest width of the P pillar, for example about 2 microns. Zone 2 is formed on top of zone 1 and may have about 3 microns width. Similarly, zone 3 may be formed on top of the zone 2 and may have 4 microns width. Finally, zone 4 may be formed on top of the zone 3 and may have 5 microns width. As understood, in this example, when having a rectangular shape, the lateral area of zone 1 with 2 microns width and 20 microns length becomes 2×20 microns square, and the lateral areas of the zone 2-zone 4 become 3×21, 4×22 and 5×23 microns square respectively by gradual increments of lateral area. Each zone as a rectangular prism may have a volume which is equal to 10 microns×lateral area. Each zone is symmetrically stacked on top of another along a vertical axis of the pillar that they form. Each lateral area may be orthogonal to the vertical axis of the pillar, and each area may also be parallel to the buffer and or substrate layer on which they are formed.

Figure 1:
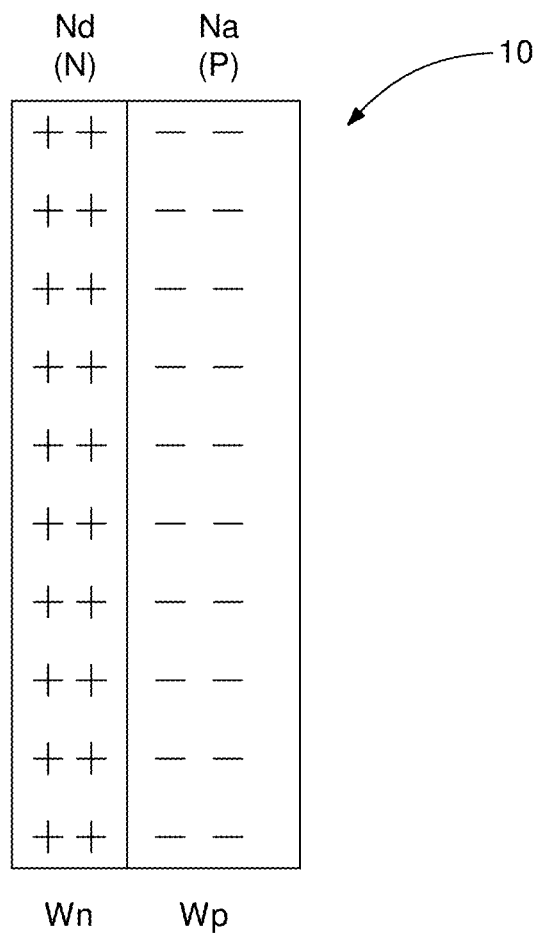
FIG. 1 is a schematic illustration of an exemplary device structure with fully depleted P and N regions in a charge balanced PN junction.

As shown above in the background, in Equation 1, conventionally basic one dimensional (1D) charge balance of P and N regions may be given as total ionized donors in N region and total acceptors in P region. This may be a good approximation for the strip cell type super junctions as shown in FIG. 1. However, for close cell type super junction structures such as square and rectangular, as exemplified in FIGS. 3A-3B, or other shapes such as hexagonal (hex) and circular shaped super junctions, two dimensional (2D) or areal charge balance may be required.

Figure 3C:
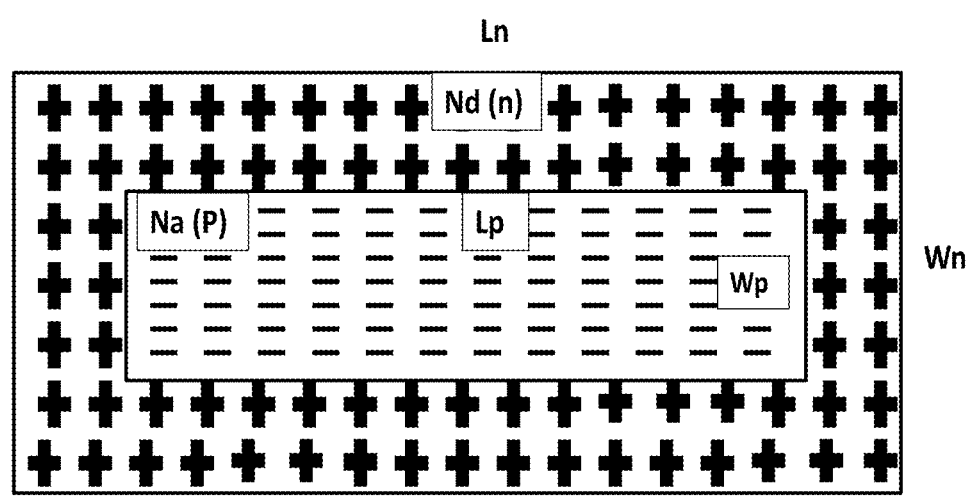
FIG. 3C is a schematic planar view illustration of an embodiment of a 2D charge balanced closed cell rectangular super junction of the present invention.

FIG. 3C shows an exemplary rectangular cell of a PN super junction, where 2D charge balance (CB) approach may be used to design and optimize a CB region for such close cell type super junction cell designs. For clarity, specific examples will be given for rectangular cell type SJ cell structures or devices. FIG. 3C shows an exemplary top planar view of a 2D charge balanced rectangular super junction having a rectangular P area surrounded by a rectangular N area. 2D or areal charge balance may be expressed with the following equation:

$$N_d \times ((L_n \times W_n) - (L_p \times W_p)) = N_a \times (L_p \times W_p)$$ [Equation 2]

In this embodiment, as mentioned above PN super junctions may be formed with P regions 210 shaped as P pillars 212, having rectangular shape, surrounded by the N region 220. However, the PN super junctions may be alternatively formed with N type pillars surrounded with an N region (not shown). Both the P regions 210 and the N regions 220 in each super junction may be divided into multiple zones (zone 1 to zone n) with varying lateral widths and doping concentration according to present invention to improve manufacturing window and high current and high voltage operation performance of the small pitch SJ power MOSFETs.

Figure 3D:
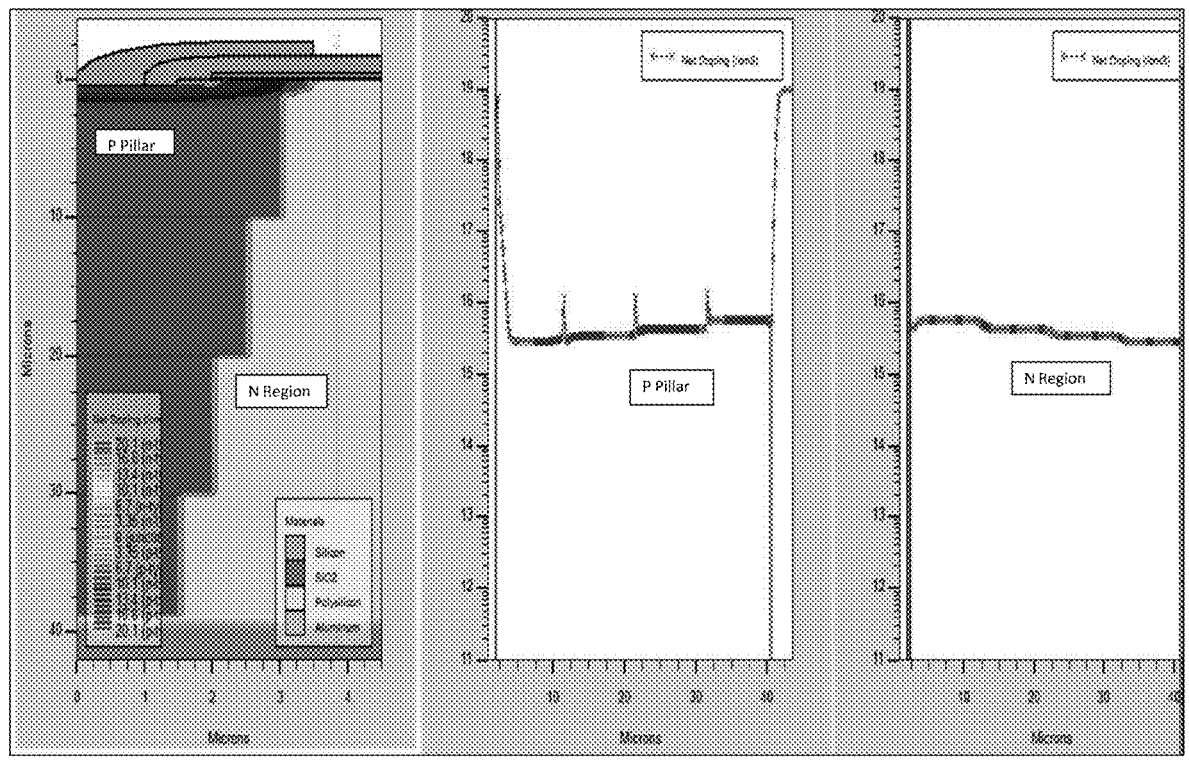
FIG. 3D is a graph of a cross section of a staircase P pillar SJ cell which is simulated using TCAD showing net doping profiles in a vertical direction in P pillar and N region.

FIG. 3D shows exemplary technology computer aided design (TCAD) simulations of the SJ structure with multi zone staircase P pillar simulated with net doping profile. The net doping profiles are shown in a vertical direction in P pillar and N region.

Figure 3E:
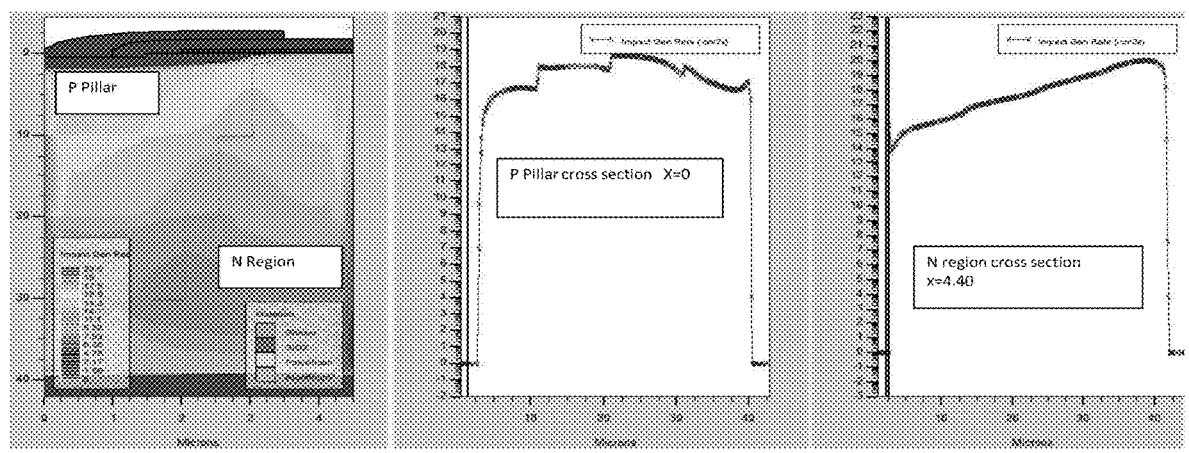
FIG. 3E is a graph showing impact ion generation rate at breakdown voltage and its profile along the vertical direction in P pillar and N region.

FIG. 3E shows where the breakdown locations via impact ion generation are. The impact ion generation rate at breakdown voltage is shown along with its profile along the vertical direction in P pillar and N region.

The SJ structure of the present invention may enable breakdown to be located deep inside the charge balanced drift region to construct avalanche ruggedized small pitch SJ power MOSFET. Avalanche ruggedness may be defined as a condition of a MOSFET safely operating at high current under avalanche breakdown. Additionally, having a wider N region at the N+ drain side may lower the drain current saturation due to the depletion of the narrow N region in small pitch SJ structure.

In one embodiment, the impact of the multi zone staircase P pillar on the SJ cell pitch may be minimized by reducing the step size difference between the adjacent zones, for example from about 1 micron down to about 0.5 micron or less than 1 micron range, for example, in the range of 0.9-01 micron.

Smaller pitch zones may be formed using exemplary data from Table 1 shown below. As will be described more fully below, in one embodiment, the super junction of the present invention comprises a drift region including at least one pillar of a first conductivity type, e.g., P type, may be formed by depositing a series of epitaxial layers of a second conductivity type, e.g., N type, in which forming P type zones of the P type pillars by selectively doping each epitaxial layer. Once it is formed, the drift region may comprise gradually and upwardly expanding P semiconductor material, i.e., in reversed pyramidal or reversed conical shape P pillars, and N semiconductor material forming the matrix of drift region which contains and surrounds the P pillars. In this structural configuration, the amount of P type semiconductor material forming the P pillars are increased as they grow upwardly along their vertical axis because the pillars expand laterally as explained above. However, as the P pillars get larger as they extend upwardly, the N semiconductor material forming the matrix of the drift region may be gradually reduced to compensate this enlargement. Thus the resulting drift region of the present invention may include a top region in P character (P charge dominated) and a bottom region in N character (N charge dominated). However, the entire drift region is charge balanced so that the conductivity type of the pillars and conductivity type of the matrix are opposite but equal in magnitude.

Forming of an exemplary SJ including a drift region is shown in Table 1. Table 1 shows the dimensional aspect of each P and N semiconductor bodies locked to form the drift region of the present invention. Table 1 shows zone dimensions for about 3.5 microns pitch SJ formed using a multi epitaxial (epi) process. As shown as the zones forming the pillars, and hence the P semiconductor material, gradually increase the N semiconductor material among the pillars is gradually reduced.

TABLE 1

| Zones | P Pillar Width (μm) | P Pillar Length (μm) | N Region Width (μm) | SJ Cell Pitch P Width + N width (μm) |
|---|---|---|---|---|
| Zone 1 | 1.0 | 20.0 | 2.5 | 3.5 |
| Zone 2 | 1.5 | 20.5 | 2.0 | 3.5 |
| Zone 3 | 2.0 | 21.0 | 1.5 | 3.5 |
| Zone 4 | 2.5 | 21.5 | 1.0 | 3.5 |

In order to minimize P and N over compensation and maximize Rds reduction, as the cell pitch is made smaller the process temperature must be reduced; therefore, a process including high energy ion implantation with multiple energy and doses may be used to fabricate such small pitch staircase type SJ cells or CB drift regions. During the process, in one embodiment, each zone may be broken into 2-4 epitaxial silicon deposition steps to be able to form P pillars in each zone with minimal temperature. Furthermore, each zone may have multiple epi and implant masks to form the smallest SJ cell pitch by using only the process temperature to anneal out the ion implantation damages and to grow the gate oxide. After growing N buffer on top of N+ substrate, N epi with donor ion concentration may be required for the specific zone that may be grown and boron implanted to compensate donor ions in n-type, and then the required acceptor ions in P type may be added for the P pillar.

Another exemplary embodiment of the present invention may include the use of intrinsic or near intrinsic epi layer(s) for each zone. In this embodiment, a blanket phosphor implantation may be applied to form n regions in the epi layers; next, a boron ion implantation may be applied to compensate donor ions; and finally P pillars may be formed with required acceptor ion (P ion) concentration. All implant application approached may have less charge variations but they may require more epi layer depositions and masking steps.

Another exemplary embodiment of the present invention includes floating rectangular P pillar structures. In this embodiment, rectangular P type pillar charge which is balanced with the N type region may be floating. In this context, the term 'floating' defines that each P pillar may not be connected to a source electrode (top electrode) of the SJ power MOSFET. In this embodiment, the rectangular shape P pillars may be substantially longer (20 microns) than the width (about 1 micron) of a planar MOSFET poly silicon gate and trench width of a trench MOSFET.

In this embodiment, floating P type pillar and MOSFET cells may be orthogonal to each other. Furthermore, each floating P pillars are connected to the P body of the MOSFET, thus there may be no need to align the transistor P body with the P pillars in the active MOSFET region of the SJ power MOSFET. The floating P pillars are very critical to the design of high voltage edge termination region for different size SJ power MOSFET devices. As a result, there may be no need for an additional epi layer to connect all the floating P pillars in the active MOSFET portion of the small pitch SJ MOSFET to source electrode in this embodiment.

FIGS. 4A-4D show various structural views of a SJ MOSFET semiconductor device of the present invention including PN super junction with floating rectangular P pillars.

Figure 4A:
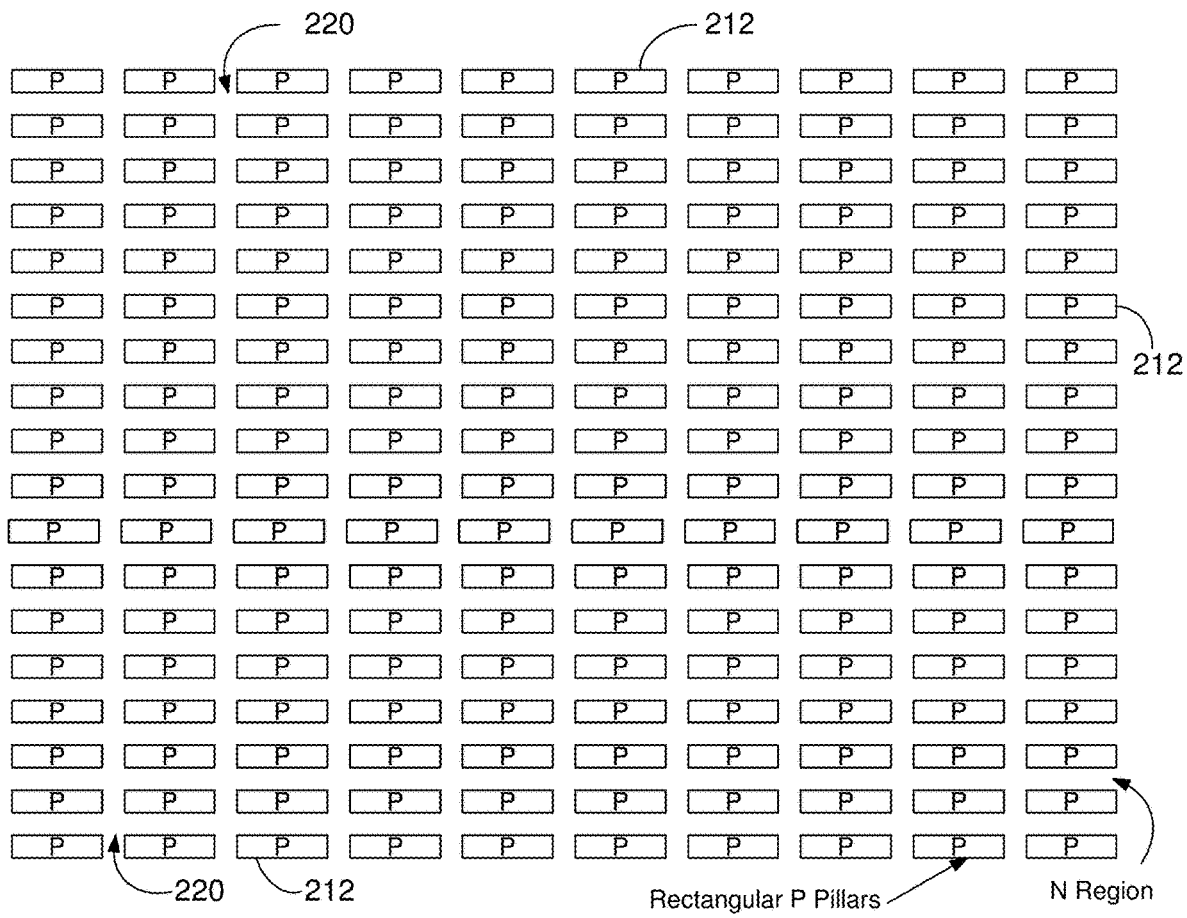
FIG. 4A is a schematic illustration of a top view of SJ MOSFET wafer pattern including charge balanced rectangular shape P pillars.
Figure 4B:
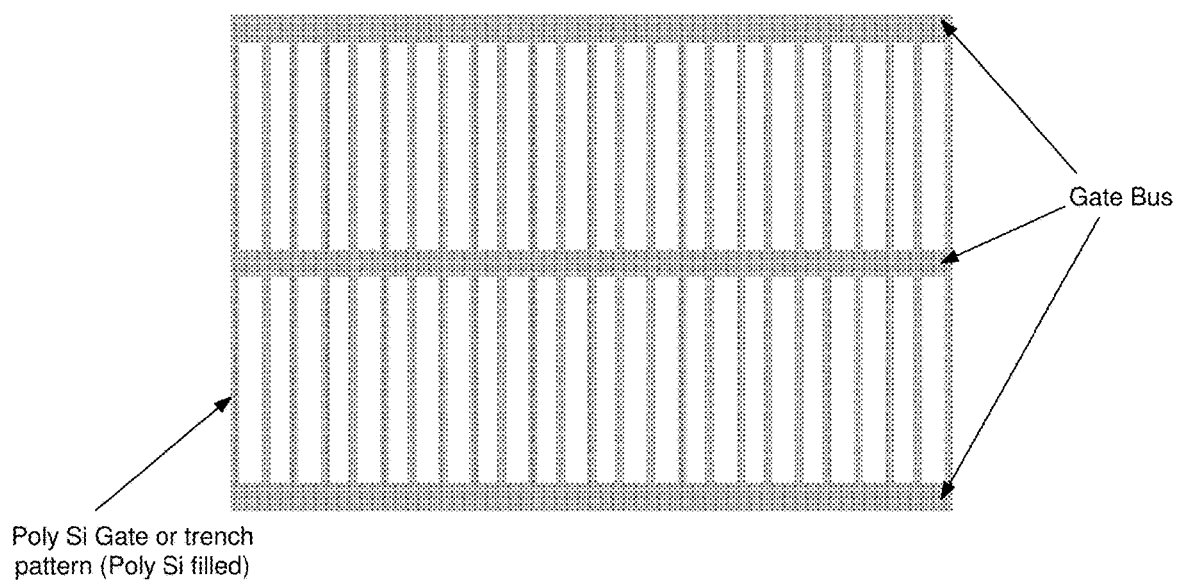
FIG. 4B is a schematic illustration of an active MOSFET cell gate pattern.

FIG. 4A shows the top view of the SJ MOSFET wafer pattern including the rectangular shape P pillars 212 of the P region 210 with N type region 220. FIG. 4B shows an active MOSFET cell gate pattern for the SJ MOSFET device.

Figure 4C:
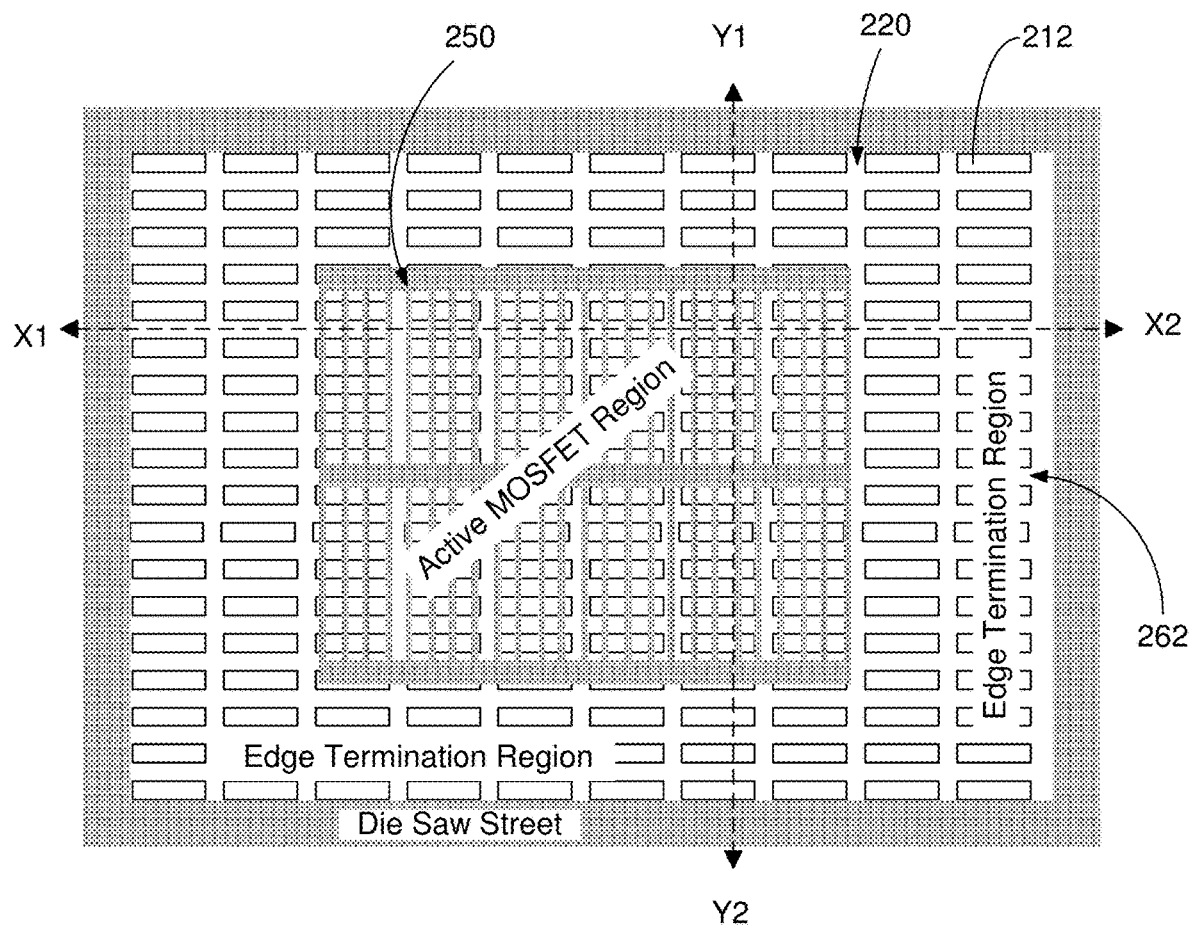
FIG. 4C is a schematic illustration of a top view of SJ MOSFET device showing gate and pillar pattern.

FIG. 4C shows, in top view, the SJ MOSFET device of the present invention having gate and P pillar pattern. An embodiment of the composite SJ power MOSFET device design is shown in according with the present invention including the orthogonal gate and the rectangular shape floating P pillars pattern. In this embodiment, a reduction in the gate-drain capacitance (Cgd) for faster switching presents itself as an additional benefit from the orthogonal MOSFET gate and P pillar device structure.

Figure 4D:
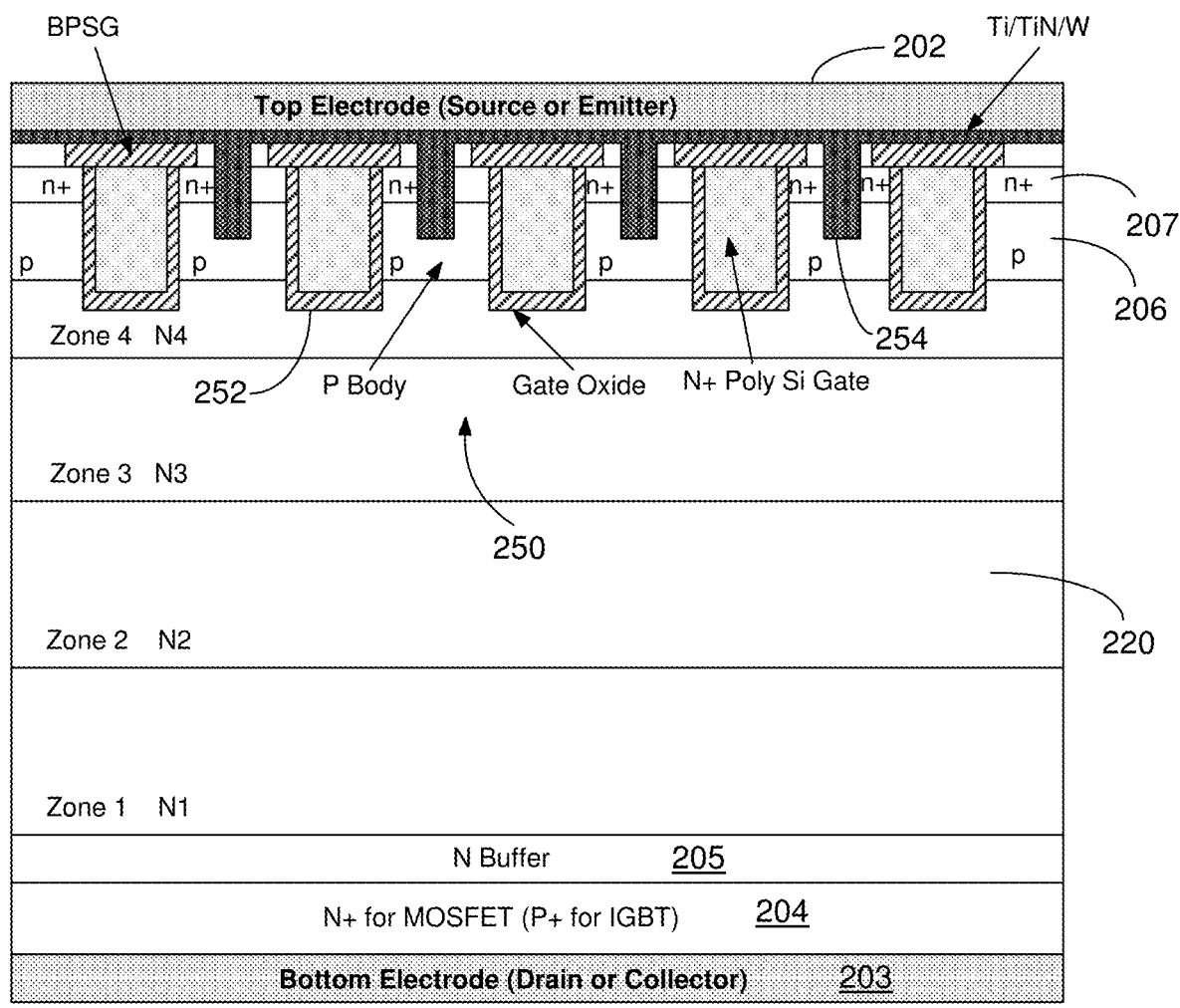
FIG. 4D is a schematic illustration of a wafer cross section in X1-X2 direction of the active MOSFET cells shown in FIG. 4C.

In FIG. 4D, wafer cross section of the active MOSFET cells 250 between the P pillar rows taken along the X1-X2 direction shown in FIG. 4C. The active MOSFET cells include gate trenches 252, contact trenches 254, P body region 206 and N+ source region 207. The gate trenches 254 may extend orthogonal to the longer edge of the rectangular P pillars 212 shown in FIG. 4C.

Figure 4E:
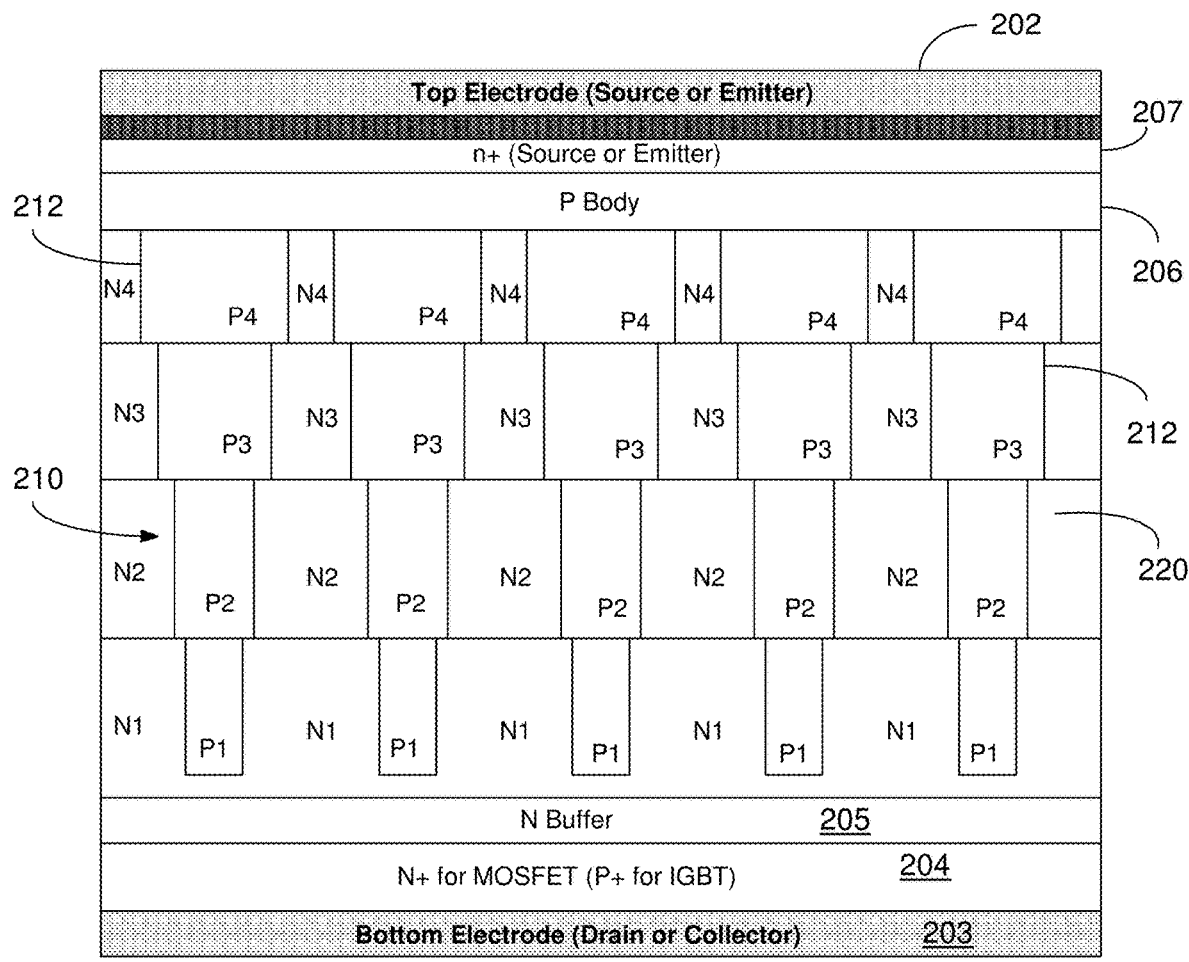
FIG. 4E is a schematic illustration of a wafer cross section in Y1-Y2 direction of the active MOSFET cells shown in FIG. 4C.

FIG. 4E shows wafer cross section of active MOSFET cells taken along the Y1-Y2 direction shown in FIG. 4C, including SJ structures with multi zone staircase P pillars 212.

Figure 5:
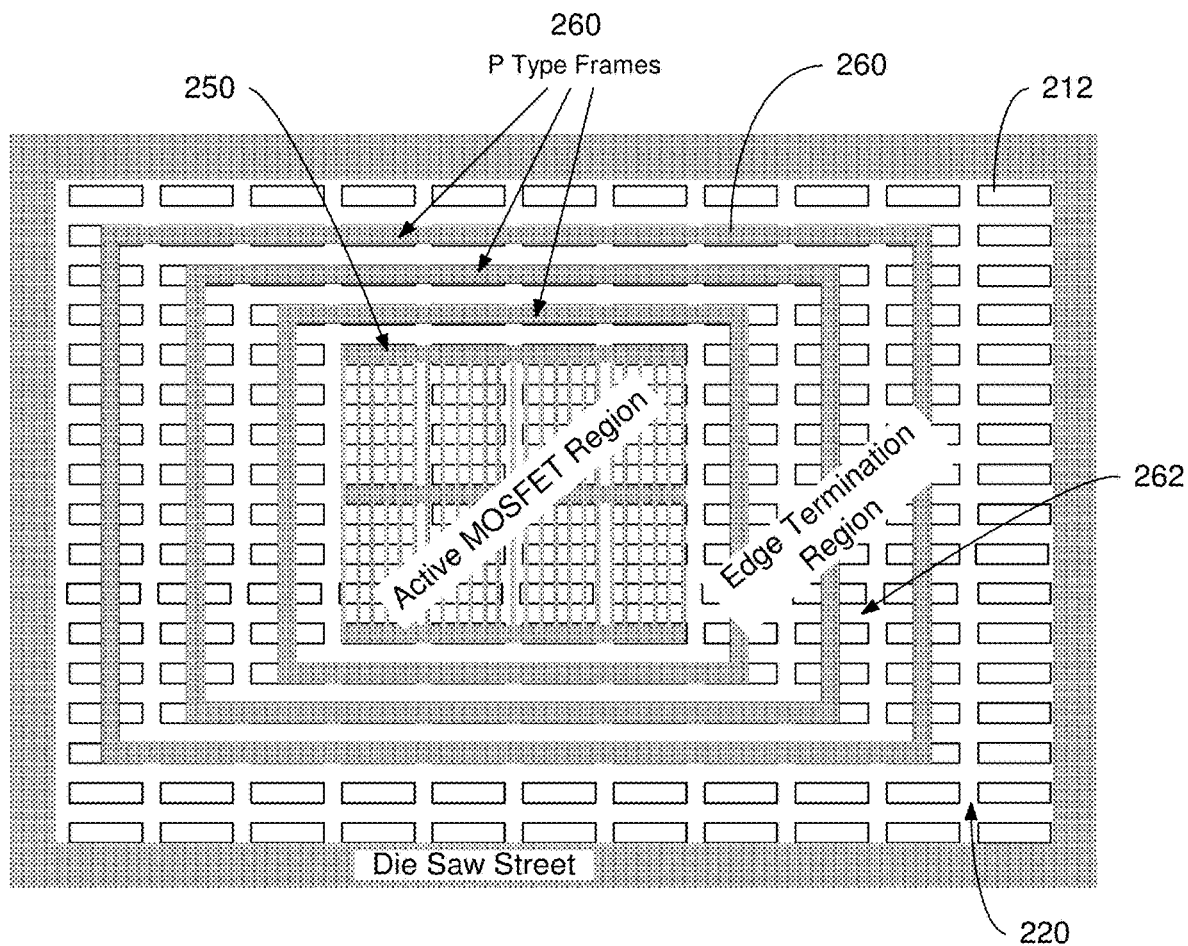
FIG. 5 is a schematic illustration of a top view of a SJ MOSFET device including edge termination rings formed by connecting floating rectangular shape P pillars.

FIG. 5 shows a top view of a SJ MOSFET device including edge termination rings 260 formed by connecting floating rectangular shape P pillars. This embodiment of the present invention may include an edge termination 262 or a high voltage termination region with rectangular shape floating P type pillars. Rectangular floating P type pillars, which are charge balanced with the N type epitaxial background (N region) outside the active MOSFET region 250, may be connected by a p type implant to enclose all active MOSFET region just like a frame. In this approach, each p type frame may be used similar to conventional floating P type ring.

Multiple rectangular P type frames may be constructed to reduce electric field by spreading potential laterally towards the outer edges of the SJ MOSFET device. Whole wafer of the SJ MOSFET device may have the same P pillar and N background epitaxial layer; therefore, a P type compensation implant may be used to reduce the surface concentration of the N regions. High energy boron ion implantation may be used to create lightly doped N− regions below the surface to make this high voltage termination less sensitive to surface or external charge. Additionally, outer frames may include a field plate to make surface of the edge termination region less external charge sensitive and more robust. Features which are shown in the Figures in this application are not to scale, for instance, in FIG. 5 the real size of the active MOSFET gate pattern and termination rings are much smaller than the die size.

Figure 6A:
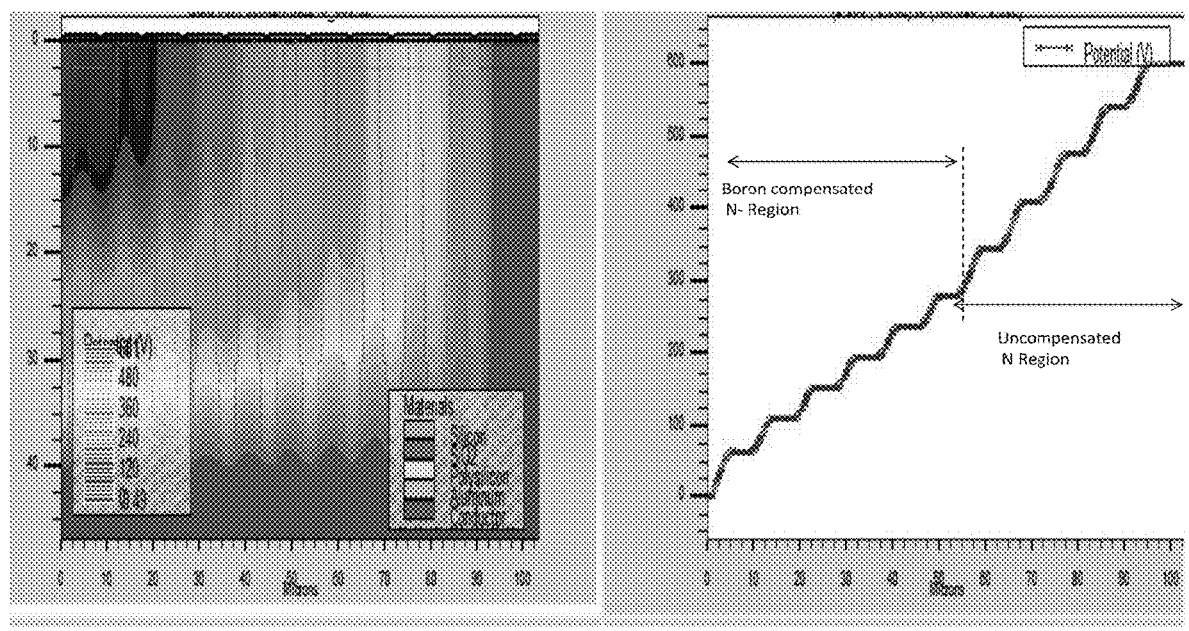
FIG. 6A is a schematic illustration of potential distribution of a cross section of the HV termination region according to present invention.
Figure 6B:
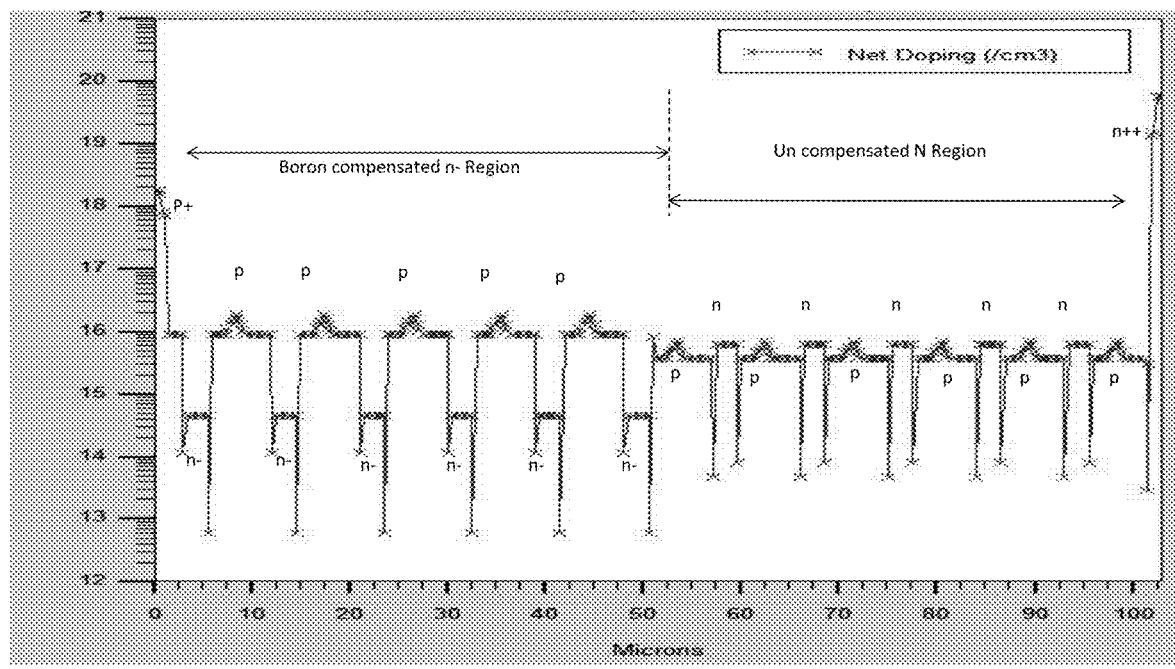
FIG. 6B is a schematic illustration of a subsurface net doping concentration of the HV termination according to present invention.
Figure 6C:
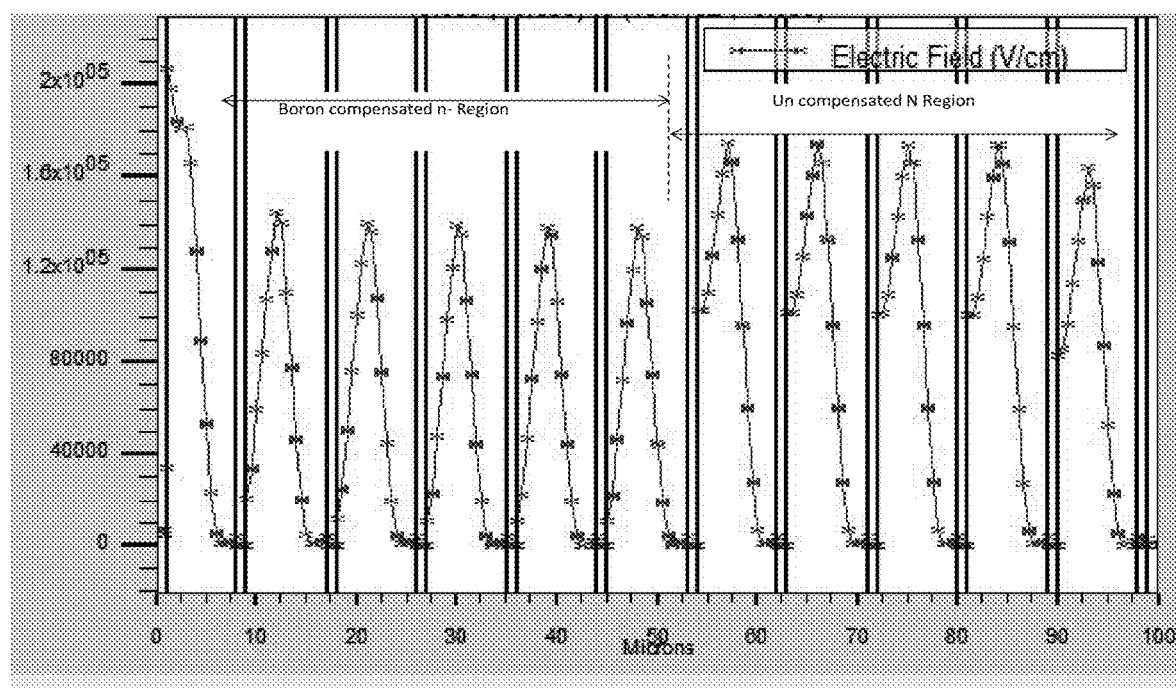
FIG. 6C is a schematic illustration of a cross-section of the HV termination region 2D electric field distribution along the surface including a step pattern.

The impact of sub surface N− compensation by boron ion implant was simulated using 2D TCAD. In FIGS. 6A-6C, the subsurface net doping concentration as well as potential and electrical field distributions are depicted. The concept of compensated N− region has a very significant impact on the surface electric field.

FIG. 6A is a graph showing potential distribution in a cross section of the HV termination region shown in FIG. 5. As shown in FIG. 6A, the potential may spread just like the step in the case of a floating field ring termination type. The potential step height may be determined by N type separation distance and the net donor ion charge concentration. As shown in FIG. 6A, after about 51 microns in the x-direction, potential step heights are increased, almost doubled. The reason for this increase in potential step height is that the net N doping concentration separating the P pillars is reduced before 51 microns along the x-direction by using a boron ion counter-doping. Because of the higher N concentration after the 51 micron mark point in the x-direction, it takes higher potential to deplete N region to reach the next floating P pillar.

FIG. 6B shows a subsurface net doping concentration of the HV termination according to present invention.

FIG. 6C shows an exemplary cross-section of the HV termination region 2D electric field distribution along the surface including a step pattern.

Figure 6D:
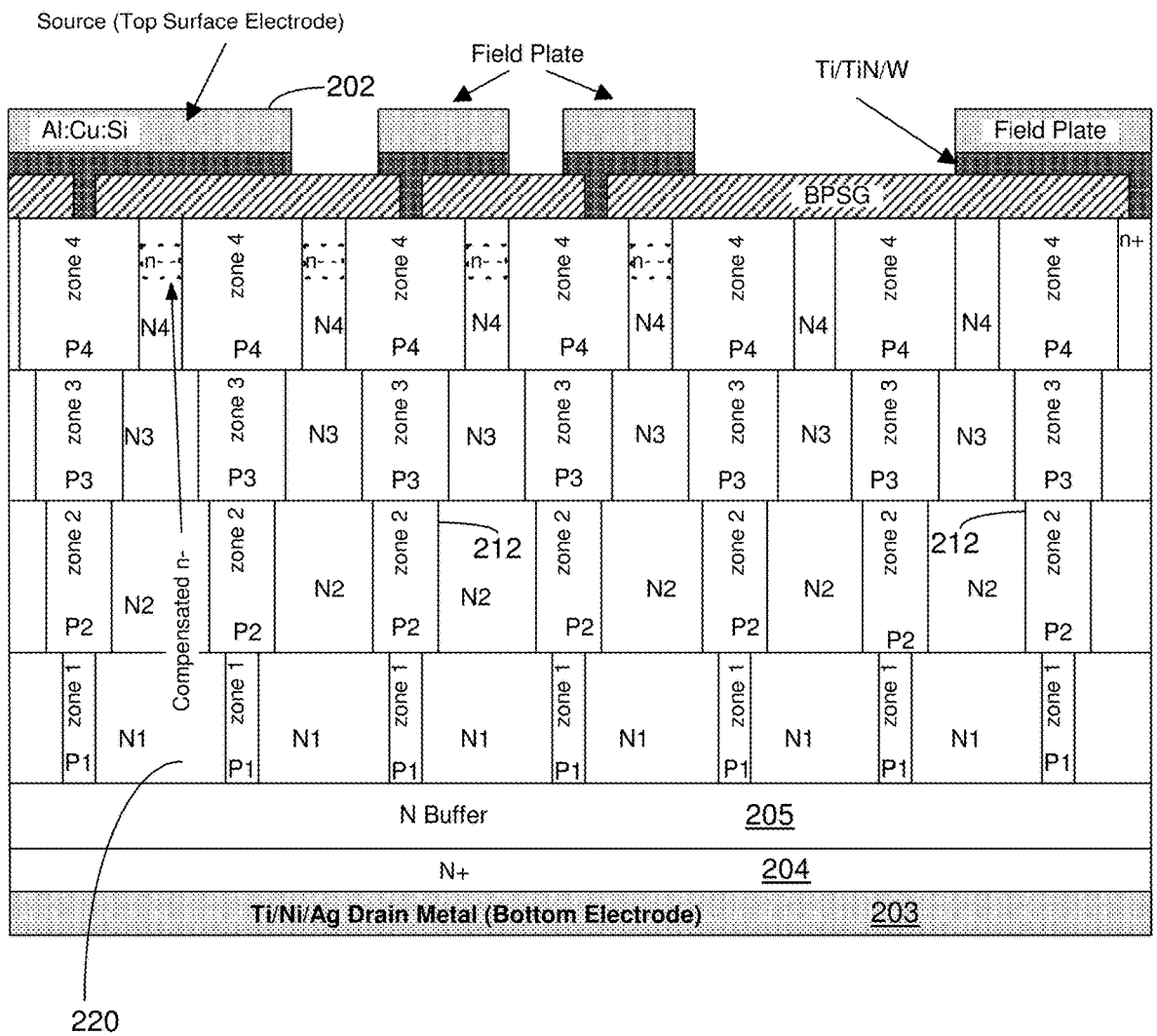
FIG. 6D is a schematic illustration of a cross section of an edge termination region for a SJ MOSFET.
Figures 7A, 7B, 7C:
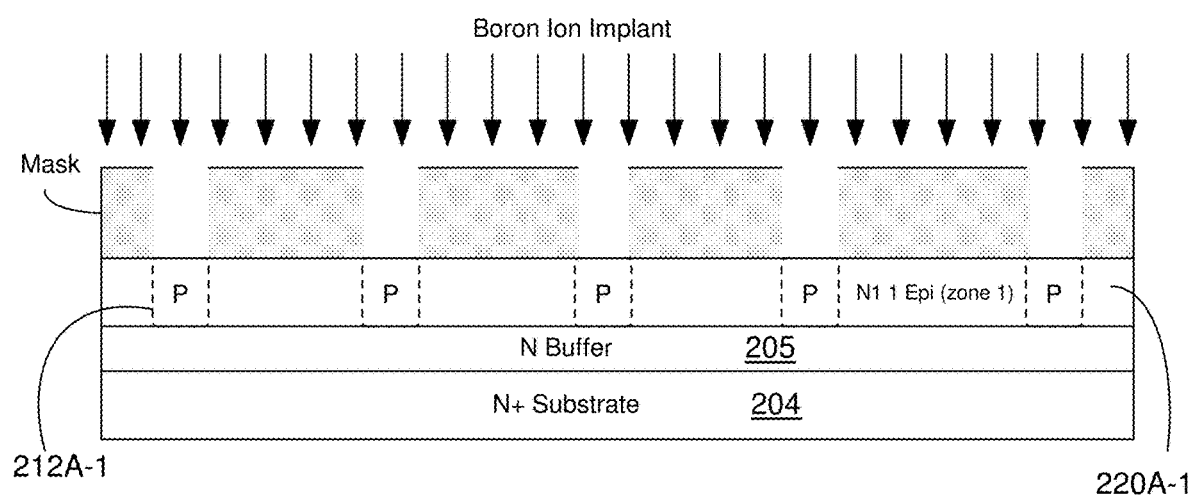
FIGS. 7A-7E are schematic illustrations of a process embodiment to form an embodiment of a super junction of the present invention.
Figure 7D:
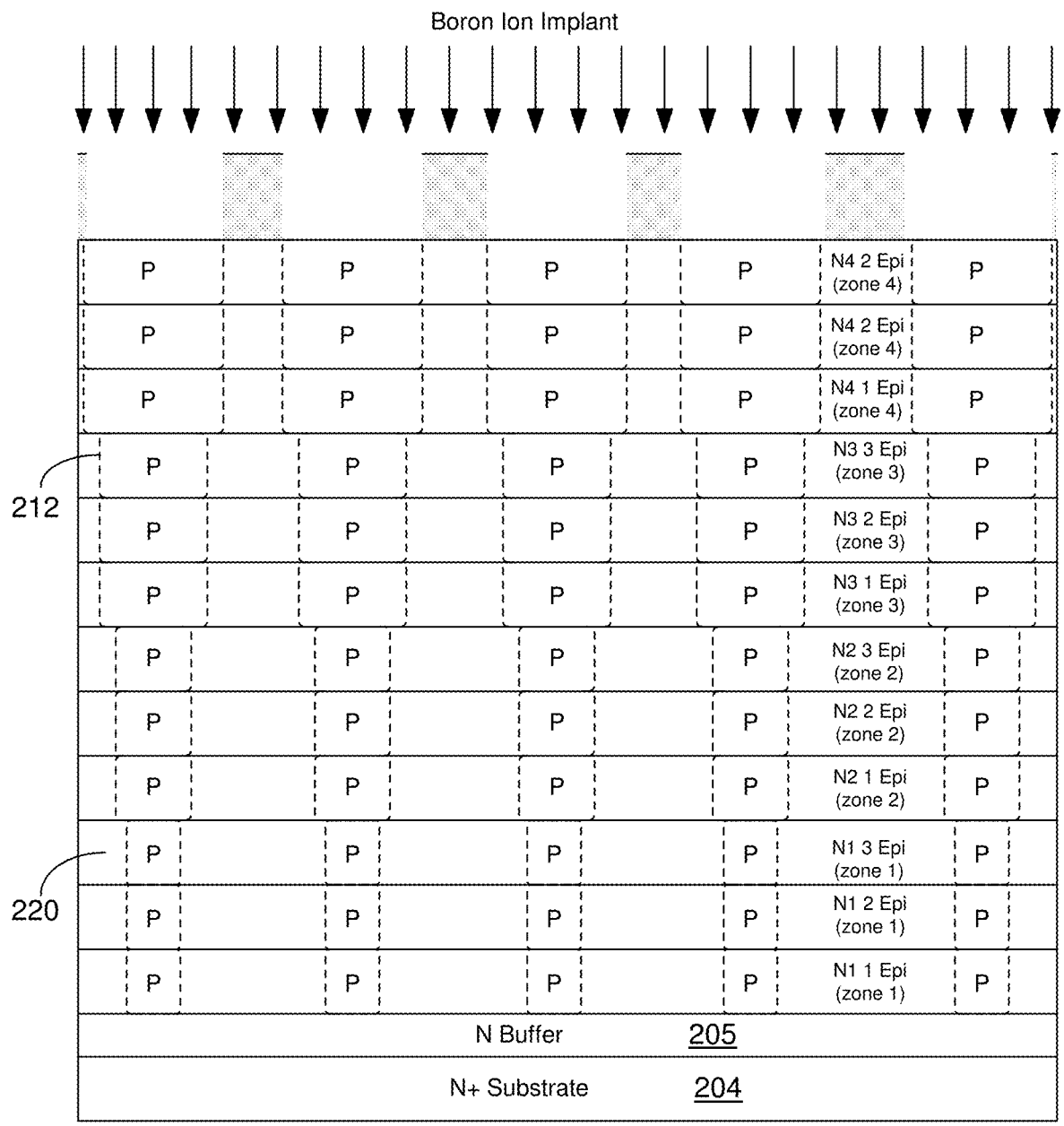
Figure 7E:
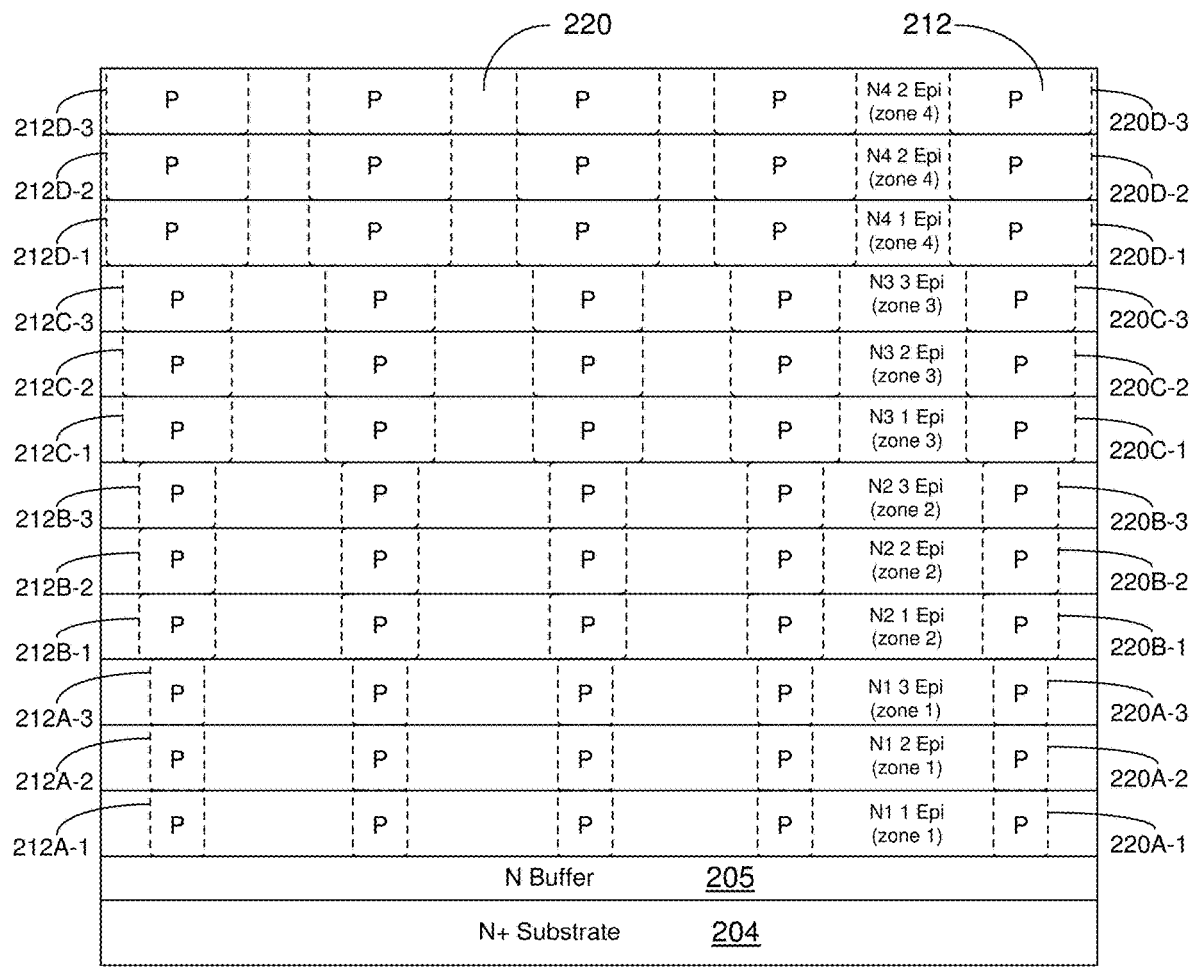

FIG. 6D shows an exemplary cross-sectional view of an edge termination region for a SJ MOSFET. As shown in FIG. 6D, a high voltage termination region is shown including field plates to minimize the impact of the external fixed or mobile charge impacting potential spreading and electrical field distribution to enhance long term SJ MOSFET reliability. FIG. 6D also shows compensated N− region.

FIGS. 7A-7E show an embodiment of a fabrication process for forming a super junction of the present invention including a drift region having staircase P pillars 212. FIGS. 7A-7E generally show the process steps including epitaxial growth, photo masking and boron ion implantation to form P and N junction pairs, namely, P pillars 212 (P semiconductor regions) having four exemplary zones and N matrix 220 (N semiconductor region).

As shown, each zone may also include three epitaxial layers, each having a thickness of about 1-4 microns. Depending on the cell pitch of the charge balanced P and N junction pair, the number of epitaxial layers (220A-1, 220A-2, 220A-3 . . . 220N-1, 220N-2, 220N-3), P zones (212A-1, 212A-2, 212A-3 . . . 212N-1, 221N-2, 212N-3), and the number of photo masking and ion implantation steps may be reduced or increased. Dopant ions may be implanted using an energy range of about 60 KeV-3 MeV and implant dose range of about 5E11-1E13 $cm^{-2}$.

For a small pitch P pillar type SJ wafer fabrication, instead of growing N type epi layers, intrinsic or very lightly doped epi layers may be grown and phosphor ion may be implanted without a mask for better charge control.

In FIGS. 7A-7E, all of the N epitaxial silicon layers may be replaced with intrinsic epitaxial silicon layers and a phosphor ion implant may be applied before the photomask, and next boron dopant may be implanted to form P pillars in each zone with photomask.

Although aspects and advantages of the present invention are described herein with respect to certain embodiments, modifications of the embodiments will be apparent to those skilled in the art. Thus, the scope of the present invention should not be limited to the foregoing discussion, but should be defined by the appended claims.

I claim:

1. A method of manufacturing a charge balanced semiconductor device, comprising:
   forming pillars of first conductivity type in a second conductivity type semiconductor region having a top surface and a bottom surface being adjacent to a substrate being heavily doped with the second type conductivity dopants, including:
- forming a first layer of the second conductivity type semiconductor region over the substrate, the first layer being a bottom layer of the second conductivity type semiconductor region,
- selectively implanting first conductivity type dopants into the first layer to form first zones of the pillars, the first zones being the bottom zones of the pillars;
- annealing the first layer,
- forming a second layer of the second conductivity type semiconductor region on the first layer,
- selectively implanting the first conductivity type dopants into the second layer to form second zones of the pillars,
- annealing the second layer, and
- repeating steps of forming, selectively implanting, and annealing until top zones of the pillars being formed in a top layer of the second conductivity type semiconductor region including the top surface;

wherein each pillar gradually expanding in the direction of the top surface so that the top zone being larger than the bottom zone, and the second conductivity type semiconductor region, surrounding the pillars, being gradually expanding in the direction of the bottom surface so that a top portion of the second conductivity type semiconductor region being smaller than a bottom portion; and wherein the pillars and the second conductivity type semiconductor region surrounding the pillars are repeated having opposite charge in equal magnitudes.

2. The method of claim 1, wherein the pillars and the second conductivity type semiconductor region surrounding the pillars include multi zones with the same size and doping across a semiconductor wafer including device edges.

3. The method of claim 1, wherein each zone of the pillars includes varying width and varying doping levels to achieve a charge balance in each zone.

4. The method of claim 1, wherein each zone of the pillars includes one or more regions with the same width and varying net doping levels.

5. The method of claim 1, further comprising forming a transistor device within at least the top layer by implanting the first conductivity type ions.

6. The method of claim 5, further comprising forming gate regions within the top layer by etching trenches that are orthogonally positioned with respect to longer edges of the top zones within the top layer.

7. The method of claim 6, further comprising forming a framing-layer on the top layer including the top zones by ion implantation of the first conductivity type dopants connecting the top zones at edge termination regions of the semiconductor device.

8. The method of claim 7, wherein the second conductivity type semiconductor region is compensated by implanting the first conductivity type dopants to form a subsurface lighter doped second conductivity type layer to spread potential laterally further out in the edge termination regions to achieve high breakdown voltage.

9. The method of claim 1, wherein the first conductivity type is P type and the second conductivity type is N type.

10. The method of claim 1, wherein selectively implanting the first conductivity type dopants includes using an implant energy range of about 60 KeV-3 MeV and implant dose in a dose range of about 5E11-1E13 $cm^{-2}$.

11. The method of claim 1, wherein annealing includes annealing at a temperature range from 600° C. to 1000° C.

12. The method of claim 1, wherein the top zone is rectangular prism shape and parallel to and contacts to the top surface.

13. The method of claim 1, wherein the bottom zone is rectangular prism shape and it is parallel to and contacts to the bottom surface.

14. The method of claim 1, wherein each zone of the pillars is rectangular prism shape and they are parallel to the top surface and the bottom surface.

15. The method of claim 1, wherein, the top zone is a close cell shape including rectangular, square, circular, or hexagonal shapes.

* * * * *